United States Patent
Lee et al.

(10) Patent No.: US 9,246,116 B2
(45) Date of Patent: Jan. 26, 2016

(54) METHOD OF MANUFACTURING LIGHT-ABSORBING LAYER HAVING SEMICONDUCTOR NANOPARTICLES AND METHOD OF MANUFACTURING SEMICONDUCTOR DEVICE HAVING THE SAME LIGHT-ABSORBING LAYER

(71) Applicant: SNU R&DB FOUNDATION, Seoul (KR)

(72) Inventors: Changhee Lee, Seoul (KR); Kookheon Char, Seoul (KR); Seonghoon Lee, Seoul (KR); Donggu Lee, Seoul (KR); Jaehoon Lim, Seoul (KR); Jiyun Song, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/149,529

(22) Filed: Jan. 7, 2014

(65) Prior Publication Data
US 2015/0004736 A1 Jan. 1, 2015

(30) Foreign Application Priority Data
Jul. 1, 2013 (KR) .......................... 10-2013-0076427

(51) Int. Cl.
H01L 21/00 (2006.01)
H01L 51/42 (2006.01)
B82Y 40/00 (2011.01)

(52) U.S. Cl.
CPC .............. *H01L 51/426* (2013.01); *B82Y 40/00* (2013.01)

(58) Field of Classification Search
CPC .................. H01L 21/02628; H01L 21/02601; H01L 31/055

USPC ................................................ 438/63, 69, 72
See application file for complete search history.

(56) References Cited

U.S. PATENT DOCUMENTS

| 2012/0312375 A1* | 12/2012 | Seok et al. ................. 136/263 |
| 2013/0280854 A1* | 10/2013 | Jasieniak ............... B82Y 30/00 438/93 |
| 2014/0046083 A1* | 2/2014 | Tilyou et al. .................... 556/19 |
| 2014/0346442 A1* | 11/2014 | Nag .................... H01L 29/0665 257/29 |

FOREIGN PATENT DOCUMENTS

| JP | 2013-055178 | 2/2013 | ............. H01L 31/04 |
| KR | 10-2011-0095214 | 8/2011 | ............ H01L 31/042 |
| KR | 10-2011-0095215 | 8/2011 | ............ H01L 31/042 |
| KR | 10-1055117 | 8/2011 | ............ H01L 31/042 |
| KR | 10-2013-0011503 | 1/2013 | ............. H01L 31/18 |

OTHER PUBLICATIONS

Anderson et al. "Soluble, Chloride-Terminated CdSe Nanocrystals: Ligand Exchange Monitored by 1H and 31P NMR Spectroscopy," Chemistry of Materials, 2013, 25, pp. 69-76; Publication Date (Web): Dec. 7, 2012.*
Korean Office Action dated Jul. 21, 2014, in Korean Patent Application No. KR 10-2013-0076427.

* cited by examiner

*Primary Examiner* — Julia Slutsker
(74) *Attorney, Agent, or Firm* — Harness, Dickey & Pierce, P.L.C.

(57) ABSTRACT

An exemplary method of manufacturing a light-absorbing layer and a method of manufacturing a semiconductor device including the same light-absorbing layer are provided. The exemplary method includes: forming a nanoparticles film by applying a semiconductor nanoparticles solution on a substrate; thermally treating the nanoparticles film at least one time to cause adhesion among the nanoparticles; and forming a light-absorbing layer by applying a light-absorbing solution on the nanoparticles film.

11 Claims, 19 Drawing Sheets

Overall Characteristics of Solar Cell for Each Surface Treatment

| Surface Treatment | $J_{SC}$ (mA/cm$^2$) | $V_{OC}$ (V) | FF (%) | PCE (%) |
|---|---|---|---|---|
| Bare | 2.80 | 0.75 | 52.4 | 1.09 |
| Pyridine | 3.52 | 0.65 | 48.8 | 1.12 |
| Hexylamine | 7.56 | 0.63 | 47.1 | 2.24 |

FIG. 11B

Characteristics of Solar Cell with Amount of Tetrapod Nanoparticles

|  | $J_{SC}$ (mA/cm²) | $V_{OC}$ (V) | FF (%) | PCE (%) |
| --- | --- | --- | --- | --- |
| w/o CdSe TP | 18.38 | 0.75 | 54.08 | 7.44 |
| CdSe TP (1 mg ml⁻¹) | 18.13 | 0.74 | 56.53 | 7.56 |
| CdSe TP (2 mg ml⁻¹) | 18.02 | 0.75 | 60.33 | 8.11 |

FIG. 12B

METHOD OF MANUFACTURING LIGHT-ABSORBING LAYER HAVING SEMICONDUCTOR NANOPARTICLES AND METHOD OF MANUFACTURING SEMICONDUCTOR DEVICE HAVING THE SAME LIGHT-ABSORBING LAYER

CROSS-REFERENCE TO RELATED APPLICATION

This application claims the benefit under 35 U.S.C. §119(a) of a Korean patent application filed on Jul. 1, 2013 in the Korean Intellectual Property Office and assigned Serial No. 10-2013-0076427, the entire disclosure of which is hereby incorporated by reference.

FIELD

Apparatuses and methods consistent with the exemplary embodiments relate to a method of manufacturing a light-absorbing layer having semiconductor nanoparticles and a method of manufacturing a semiconductor device having the same light-absorbing layer.

BACKGROUND

Semiconductor nanoparticles have a feature of being able to control an energy level variously according to size, shape, and composition thereof, and have good electric conductivity and great absorbing cross-sectional areas in comparison to organic matters. Therefore, various researches to apply such semiconductor nanoparticles to a high efficiency solar cell are ongoing.

To implement the solar cell using the semiconductor nanoparticles, processes of removing non-conductive surfactant from surfaces of the nanoparticles and implementing the nanoparticles in a film state are essential. In particular, when the solar cell is manufactured using a hybrid of semiconductor nanoparticles and conducting polymer, the amount of surfactant remaining on the surfaces of the nanoparticles greatly affects characteristics of the solar cell.

FIG. 1 illustrates an example of a related-art method of manufacturing a solar cell using nanoparticles. As shown in FIG. 1, a hybrid light-absorbing layer is manufactured by mixing surface-treated semiconductor nanoparticles and organic semiconductor material in a conducting polymer solution, and applying the mixture. By treating the surfaces of the nanoparticles which have been synthesized using amine-based material (for example, pyridine, 1-butylamine, etc.), ligands are removed from the surfaces, and a nanoparticles solution based on a non-polar solvent such as chloroform ($CHCl_3$) is manufactured. After that, a solution for manufacturing a light-absorbing layer is made by mixing the nanoparticles solution and the conducting polymer solution at a predetermined ratio, and is applied to a transparent electrode (spin coating, etc.) and is made as a film.

However, such a related-art method has a problem that colloidal stability of the surface-treated semiconductor nanoparticles is low. That is, because there is no surface ligand in the solution of the surface-treated nanoparticles or the ligand has a short length, the nanoparticles are not stabilized and precipitation easily occurs in the light-absorbing layer solution. This undermines long-term colloidal stability and also degrades reproducibility because deviation is great when devices are manufactured. Furthermore, reliability may deteriorate when the solar cell is scaled up afterward.

FIG. 2 illustrates another related-art method of manufacturing a solar cell using nanoparticles. This method is a layer-by-layer assembly method that manufactures a nanoparticles solar cell by stacking nanoparticles of a single layer several times or dozens of times. This method uses a bifunctional linker when stacking the nanoparticles layer repeatedly so that the semiconductor nanoparticles can be prevented from being washed away, and also, reduces a distance between the nanoparticles so that charge transfer between the nanoparticles can be improved.

This method has the merit of maintaining colloidal stability of the nanoparticles, but has problems that it takes much time to manufacture a device since the stacking/washing process should be performed dozens of times in order to manufacture a light-absorbing layer to absorb light sufficiently, and that device characteristics are greatly changed according to a kind of bifunctional linker.

SUMMARY

One or more aspects of the exemplary embodiments provide a method of manufacturing a light-absorbing layer, which can easily overcome a colloidal stability problem of nanoparticles by removing surfactant after implementing a film of nanoparticles, and thus can improve stability and reproducibility during a process, and a method of manufacturing a semiconductor device having the same light-absorbing layer.

One or more aspects of the exemplary embodiments also provide a method of manufacturing a light-absorbing layer, which can perform various post-treatment processes which are impossible in a solution, since a semiconductor nanoparticles film is physically fixed, and a method of manufacturing a semiconductor device having the same light-absorbing layer.

One or more aspects of the exemplary embodiments also provide a method of manufacturing a semiconductor device, which actively controls a nano structure and surface chemistry of a nanoparticles layer and combines various semiconductor materials, thereby implementing a high efficiency device.

According to an aspect of an exemplary embodiment, there is provided a method of manufacturing a light-absorbing layer including semiconductor nanoparticles, the method including: forming a nanoparticles film by applying a semiconductor nanoparticles solution on a substrate; thermally treating the nanoparticles film at least one time to cause adhesion among the nanoparticles; and forming a light-absorbing layer by applying a light-absorbing solution on the nanoparticles film.

According to an aspect of another exemplary embodiment, there is provided a method of manufacturing a light-absorbing layer including semiconductor nanoparticles, the method including: forming a nanoparticles film by applying a semiconductor nanoparticles solution on a substrate; thermally treating the nanoparticles film at least one time to cause adhesion among the nanoparticles; surface-treating the nanoparticles film with an organic/inorganic compound in a solution or a vapor to improve electrical characteristics of the nanoparticles; and forming a light-absorbing layer by applying a light-absorbing solution on the nanoparticles film.

According to an aspect of still another exemplary embodiment, there is provided a method of manufacturing a semiconductor device including a light-absorbing layer, the method including: forming a light-absorbing layer in the above-described method; and forming a semiconductor device on the light-absorbing layer.

According to an exemplary embodiment, since the nanoparticles film is implemented and then surfactant is removed, a colloidal stability problem of nanoparticles can be easily overcome and thus stability and reproducibility in the process can be improved.

Also, according to an exemplary embodiment, various post-treatment processes which are impossible in a solution (for example, a surface treatment process to improve electrical characteristics) are possible since a semiconductor nanoparticles film is physically fixed.

Also, according to an exemplary embodiment, a high efficiency device can be implemented by actively controlling a nano structure and surface chemistry of a nanoparticles layer and combining various semiconductor materials.

BRIEF DESCRIPTION OF THE DRAWINGS

FIGS. 11A and 11B are views to illustrate characteristics of a solar cell that is formed at the operation of manufacturing a semiconductor device (S430); and FIGS. 12A and 12B are views to illustrate characteristics of a solar cell that is manufactured according to an alternative embodiment.

DETAILED DESCRIPTION

Figure 1:
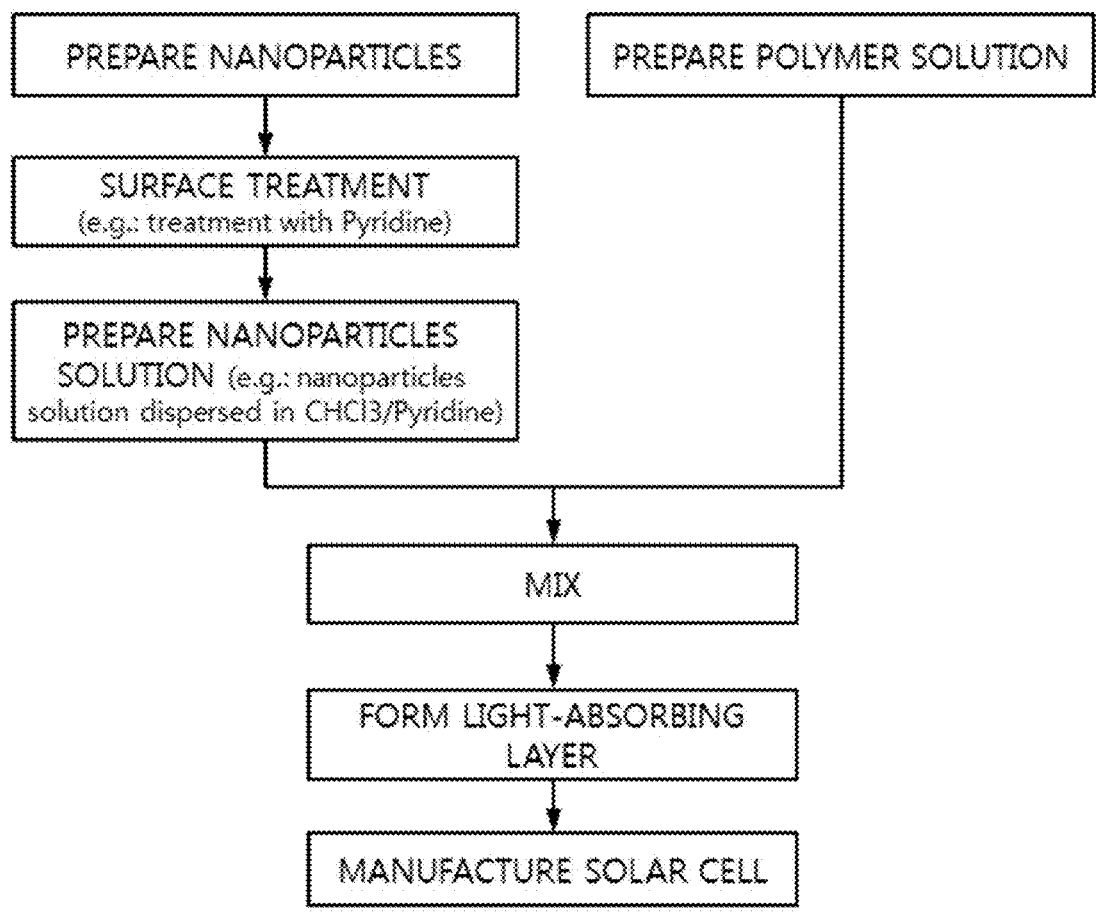
FIGS. 1 and 2 are flowcharts illustrating related-art methods of manufacturing a solar cell using nanoparticles.
Figure 2:
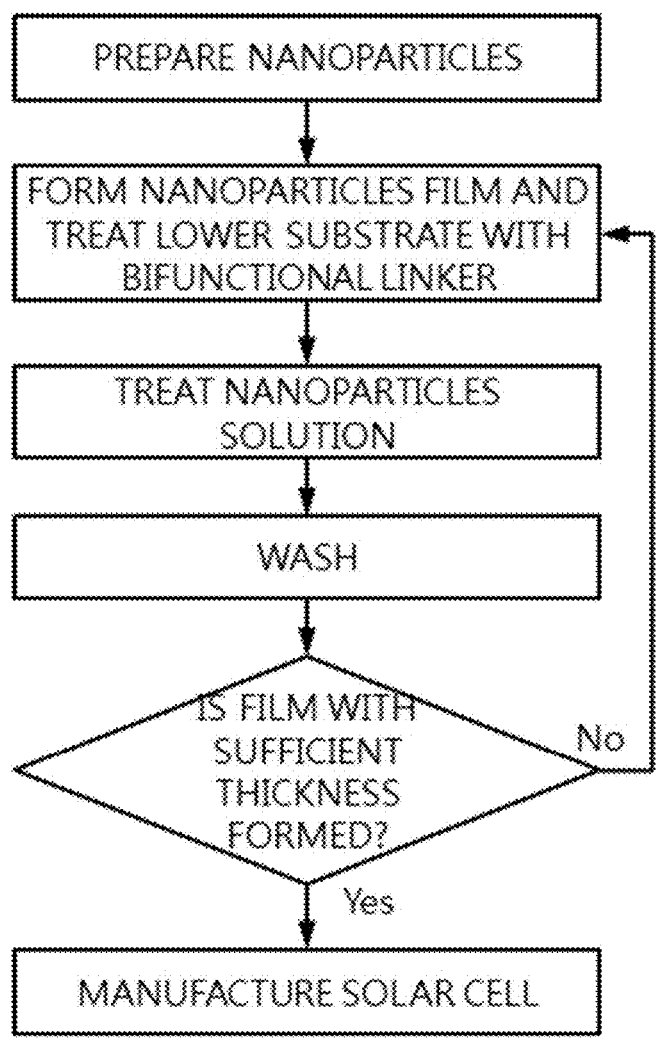

Exemplary embodiments will now be described more fully with reference to the accompanying drawings to clarify aspects, features and advantages of the inventive concept. The exemplary embodiments may, however, be embodied in many different forms and should not be construed as limited to the exemplary embodiments set forth herein. Rather, the exemplary embodiments are provided so that this disclosure will be thorough and complete, and those of ordinary skill in the art will fully understand the scope of the application.

It will be understood that when an element is referred to as being "on" another element, the element can be directly on another element or intervening elements. In the drawings, thicknesses of elements are exaggerated for easy understanding of technical features.

If the terms such as 'first' and 'second' are used to describe elements, these element should not be limited by such terms. These terms are used for the purpose of distinguishing one element from another element only. The exemplary embodiments include their complementary embodiments.

As used herein, the singular forms "a", "an" and "the" are intended to include the plural forms as well, unless the context clearly indicates otherwise. It will be further understood that the terms "comprises" and/or "comprising," when used in this specification, do not preclude the presence or addition of one or more other components.

Hereinafter, exemplary embodiments will be described in greater detail with reference to the accompanying drawings. The matters defined in the description, such as detailed construction and elements, are provided to assist in a comprehensive understanding of the exemplary embodiments. However, it is apparent that the exemplary embodiments can be carried out by those of ordinary skill in the art without those specifically defined matters. In the description of the exemplary embodiment, certain detailed explanations of related art are omitted when it is deemed that they may unnecessarily obscure the essence of the inventive concept.

Figure 3:
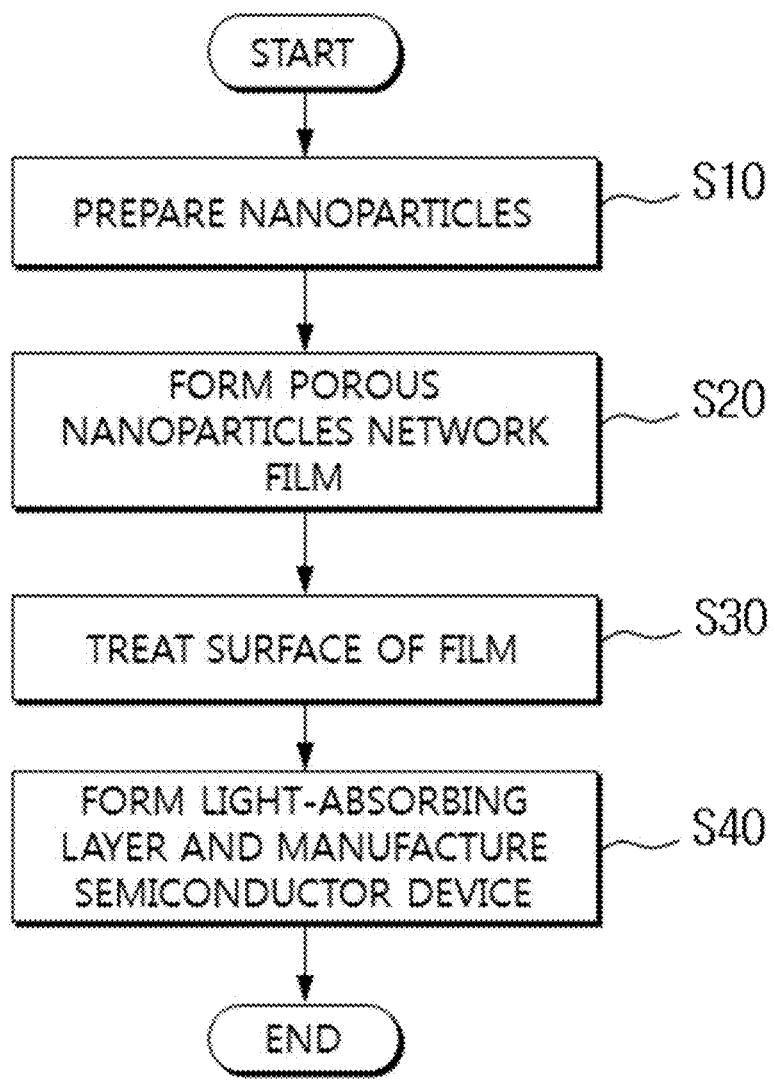
FIG. 3 is a flowchart illustrating a method of manufacturing a semiconductor device using nanoparticles according to an exemplary embodiment.
Figure 4:
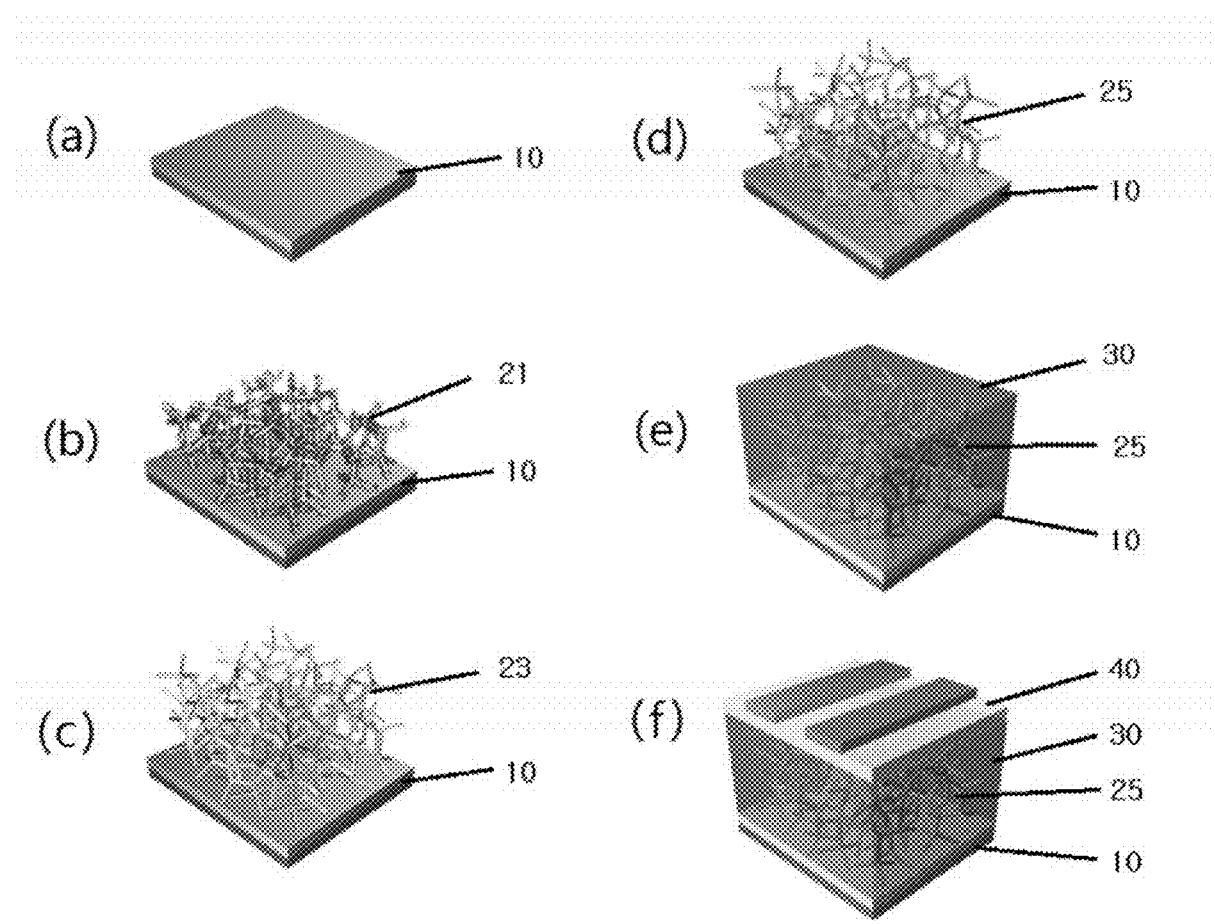
FIGS. 4A to 4F are views schematically illustrating a method of manufacturing a semiconductor using nanoparticles according to an exemplary embodiment.

FIG. 3 is a flowchart illustrating a method of manufacturing a semiconductor device using nanoparticles according to an exemplary embodiment, and FIG. 4 is a schematic view illustrating the method of manufacturing the semiconductor device using the nanoparticles.

Referring to FIG. 3, a method of manufacturing a semiconductor device according to an exemplary embodiment may include: preparing nanoparticles (S10), forming a nanoparticles network film (S20)(FIGS. 4A to 4C), treating a surface of the film (S30) (FIG. 4D), and forming a light-absorbing layer and manufacturing a semiconductor device (S40) (FIGS. 4E and 4F).

At operation of preparing the nanoparticles (S10), a solution of semiconductor nanoparticles is made. After that, surfaces of the nanoparticles may be treated (surface treatment) if necessary. For example, surface modification may be carried out to remove organic matters from the nanoparticles surfaces.

At operation S20, a porous nanoparticles network film is formed on a substrate 10 using the nanoparticles. The substrate 10 may be a transparent substrate or a transparent substrate in which a buffer layer is introduced, for example. n-type or p-type anisotropic semiconductor nanoparticles 21 are applied on the substrate 10 (FIG. 4B) and then are thermally treated and/or washed. The thermally treated and/or washed nanoparticles 23 adhere to one another and simultaneously are fixed to the substrate 10 (FIG. 4C).

At operation S30, the surface of the semiconductor nanoparticles film is treated (FIG. 4D). This surface treatment is to control electrical characteristics of the nanoparticles and may be carried out or omitted according to necessity.

At operation S40, a light-absorbing layer is formed on the surface-treated nanoparticles film 25 and a semiconductor device is manufactured on the light-absorbing layer. For example, a light-absorbing layer 30 may be formed by applying organic or inorganic light-absorbing material on the nanoparticles film or making the organic or inorganic light-absorbing material penetrate into the film (FIG. 4E), and a semiconductor device 40 may be formed on the light-absorbing layer 30 (FIG. 4F).

Shape and composition of the nanoparticles which are used to form the light-absorbing layer and manufacture the semiconductor device in the above-described method are not limited. For example, the nanoparticles may have at least one of various shapes such as a spherical dot, a rod, a tetrapod, and a hyper-branched shape. Also, the nanoparticles may consist of, but not limited to, an oxide of II-VI family (CdS, CdSe, CdTe, ZnS, ZnSe, ZnTe, HgS, HgSe or HgTe), III-V family (InP, InAs, GaP, or GaAs), IV-VI family (PbS, PbSe, or PbTe), IV family (Si or Ge), or II, III, VI, V, VI family, which has a light-absorbing characteristic.

Also, the method of applying the above-described semiconductor colloid nanoparticles on the substrate may be performed using one or more methods selected from spin coating, dip coating, spray coating, blade coating, screen printing, and inkjet printing. The nanoparticles film formed in this method may have a porous network structure and may be fixed by removing surfactant from the nanoparticles surface by thermal treatment and/or washing. Also, the light-absorbing layer may be formed by making organic and/or inorganic semiconductor material penetrate into the porous film structure.

Since the above-described nanoparticles network film is porous and is not dispersed any longer by solvents, additional surface modification is possible. Therefore, surface modification that is not possible in a related-art surface modification method carried out in a colloid solution can be simply achieved according to the present disclosure. Also, a surface modification method according to an exemplary embodiment may comprise, but not limited to, any additional surface treatment using, for example, a functional organic matter application or deposition, an application and thermal treatment of inorganic precursor, a chemical bath deposition (CBD) or a successive ionic layer adsorption and reaction (SILAR).

According to the light-absorbing layer forming method described above with reference to FIG. 3, the nanoparticles film is implemented and then surfactant is removed so that the colloidal stability problem of the nanoparticles can be easily solved and thus stability and reproducibility can be improved during the process. Also, since the semiconductor nanoparticles film is physically fixed, various post-treatment processes (for example, a surface treatment process to improve electrical characteristics like operation S30) which are difficult to carry out in solutions are possible. Furthermore, the nanostructure and surface chemistry of the nanoparticles layer are actively controlled and various semiconductor materials are combined, so that a high efficiency semiconductor device can be implemented.

Hereinafter, respective operations (S10 to S40) of FIG. 3 will be explained in detail with reference to FIGS. 5 to 11B.

Figure 5:
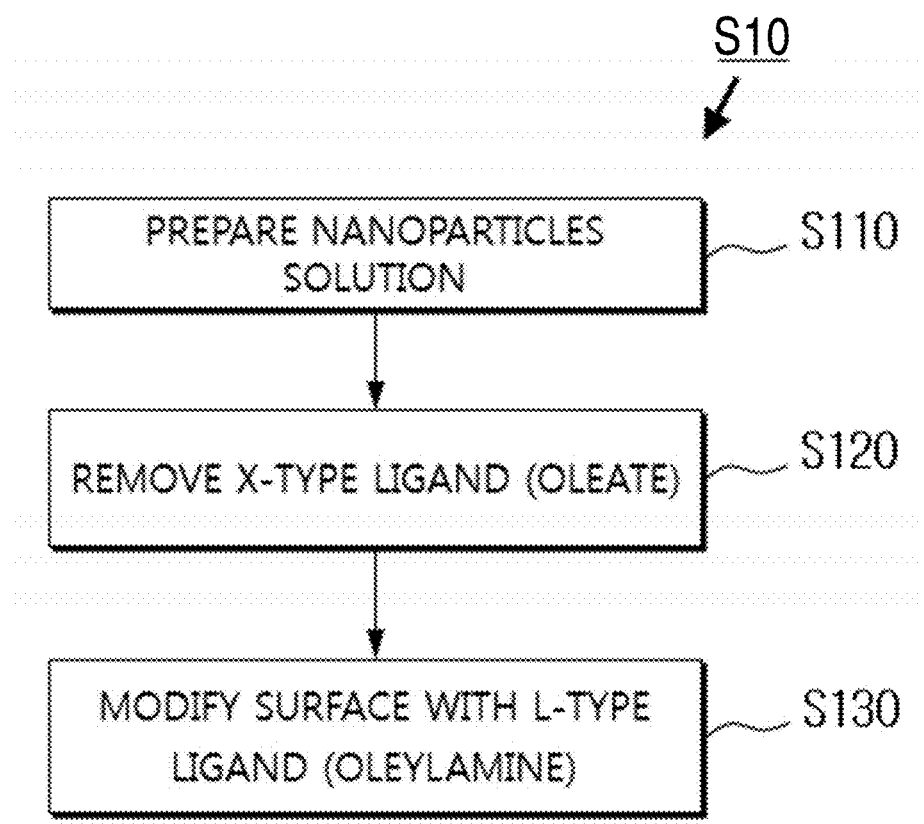
FIG. 5 is a flowchart illustrating an example of the operation of preparing nanoparticles (S10) of FIG. 3.

FIG. 5 is a flowchart illustrating an example of the operation of preparing the nanoparticles (S10) of FIG. 3. Hereinafter, a method of manufacturing a light-absorbing layer and a semiconductor device using nanoparticles of a tetrapod shape will be explained. The tetrapod nanoparticles are formed in such a manner that four branches having several to tens of nanometers share one center, and have the merits of absorbing light, separating excitons, and moving electric charge. When a film is implemented by using the tetrapod nanoparticles, a network can be effectively formed and also a pore of several to tens of nanometers can be made in the network.

Referring to FIG. 5, a solution is prepared by dispersing the tetrapod nanoparticles in a solvent at operation S110. According to an exemplary embodiment, a nanoparticles solution may be made by dispersing 200 mg of tetrapod nanoparticles fully refined after being synthesized in hexane of 5 mL.

The surfaces of the nanoparticles are modified at operations S120 and S130. The purpose of this surface modification process is to easily remove organic matters from the surfaces of the nanoparticles. For example, an X-type ligand of the surfaces of the nanoparticles may be replaced with an L-type ligand at operations S120 and S130.

The L-type ligand may be one or more compounds selected from the group consisting of primary, secondary, or tertiary alkylamine, primary, secondary, or tertiary alkylphosphine, and primary, secondary, or tertiary alkylphosphine oxide having one or more saturated, unsaturated, or aromatic hydrocarbon chains, which have 1 to 30 carbons, in a straight-chain type or branch type.

Operations S120 and S130 will be explained with reference to CdSe tetrapod nanoparticles covered with oleate which is the X-type ligand.

In general, there is a difference in porous nanoparticles network forming methods according to a chemical adhesion method of ligands existing on the nanoparticles. For example, ligands chemically adhere to the surfaces of the CdSe tetrapod nanoparticles by covalent bond (X-type ligand) in the form of carboxylate or alkylphosphonate. In order to overcome the strong chemical adhesion between the X-type ligand and the nanoparticles and separate the ligands, the surfaces of the nanoparticles may be modified, such that dispersibility of the nanoparticles is maintained and also the ligands can be easily removed. In the illustrated exemplary embodiment, the surfaces of the tetrapod nanoparticles are modified with the L-type ligand adhering to the nanoparticles by Van der Waals bond. Accordingly, the stability of the tetrapod nanoparticles solution is maintained and simultaneously the ligands can be easily removed in subsequent processes.

To achieve this, the oleate, which is the X-type ligand, is removed first at operation S120. 5 mL of N,N dimethylformamide is added to the tetrapod nanoparticles solution and then a $HBF_4$ aqueous solution (48 wt %) of 0.5 mL is injected into the tetrapod nanoparticles solution. When the tetrapod nanoparticles existing on the hexane layer is moved to the dimethylformamide (DMF) layer after short time mixture, the hexane which is supernatant is removed. After that, additional hexane may be added and washing may be performed one or more times if necessary.

In this exemplary embodiment, the ligands are separated from the nanoparticles surfaces in the form of alkylcarboxylic acid or alkylphosphonic acid by making $HBF_4$ providing protons react with alkylcarboxylate or alkylphosphonate. When the surfactant is removed in this method, the surfaces of the nanoparticles are charged by weak (+) charge and tetrafluoroborate is dispersed around the nanoparticles, and the charge charged on the surface is not sufficient to overcome the attraction between the nanoparticles and thus precipitation may occur.

At operation S130, the surfaces are modified with oleylamine which is the L-type ligand. In an exemplary method to achieve this, an excess amount of acetone is added to the nanoparticles solution. After the nanoparticles are precipitated, the solvent is removed using a centrifugal separator (for example, at 3000 rpm for 5 minutes). 1 mL of oleylamine and 3 mL of chloroform ($CHCl_3$) are added into precipitate, sufficiently agitated, and dispersed.

When re-dispersion is induced by adding the oleylamine which is the L type ligand to the nanoparticles, the surface modification is completed. The surfactant used in the re-dispersion may be primary amine. However, in an alternative embodiment, the nanoparticles may be dispersed by applying chemical species having a length sufficient to disperse the nanoparticles through dipoles interaction between the nanoparticles surfaces and the surfactant. In another alternative embodiment, the nanoparticles may be dispersed based on electronic-charge repulsive interactions by introducing the surfactant carrying charge to the surfaces. In still another alternative embodiment, the nanoparticles may be dispersed by the charge on the surfaces by controlling the aqueous solution with pH higher than/lower than an isoelectric point.

The methods used in the present exemplary embodiment are advantageous to colloidal stability as the length of the surfactant increases, and, when the surfactant has 12 carbons, the tetrapod nanoparticles with branches longer than 70 nm may be dispersed.

Figure 6A:
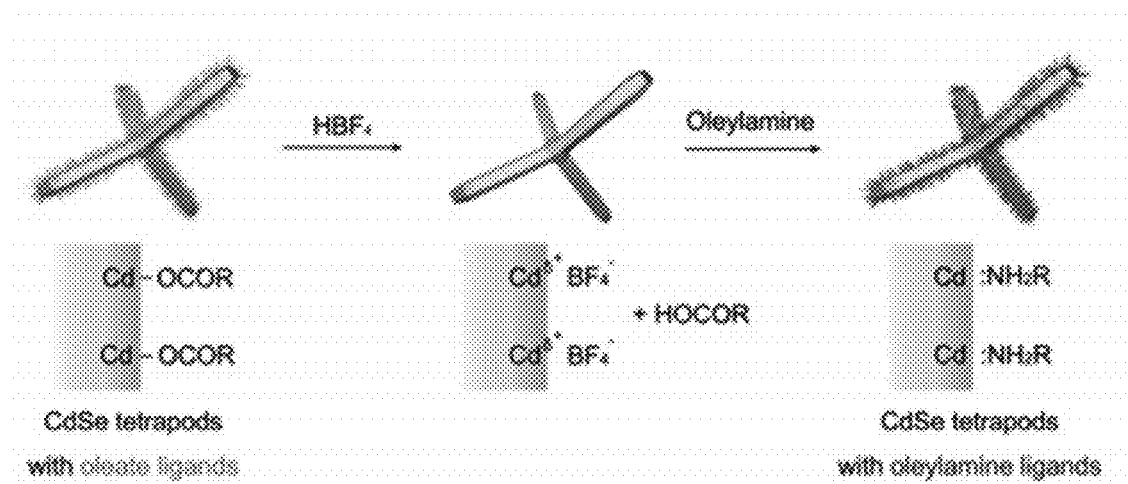
FIGS. 6A to 6C are views to illustrate surface treatment at the operation of preparing the nanoparticles (S10)
Figure 6B:
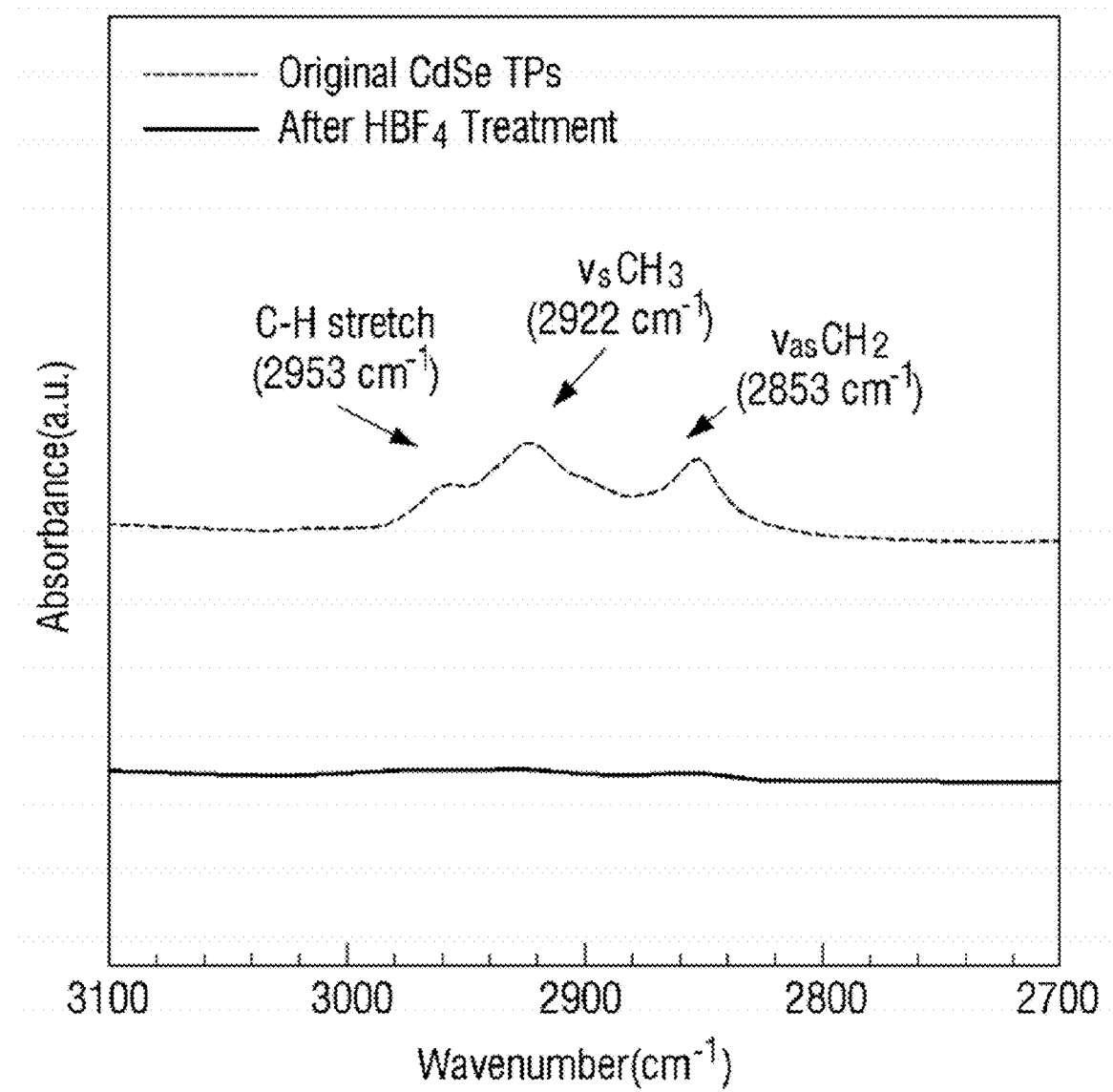
Figure 6C:
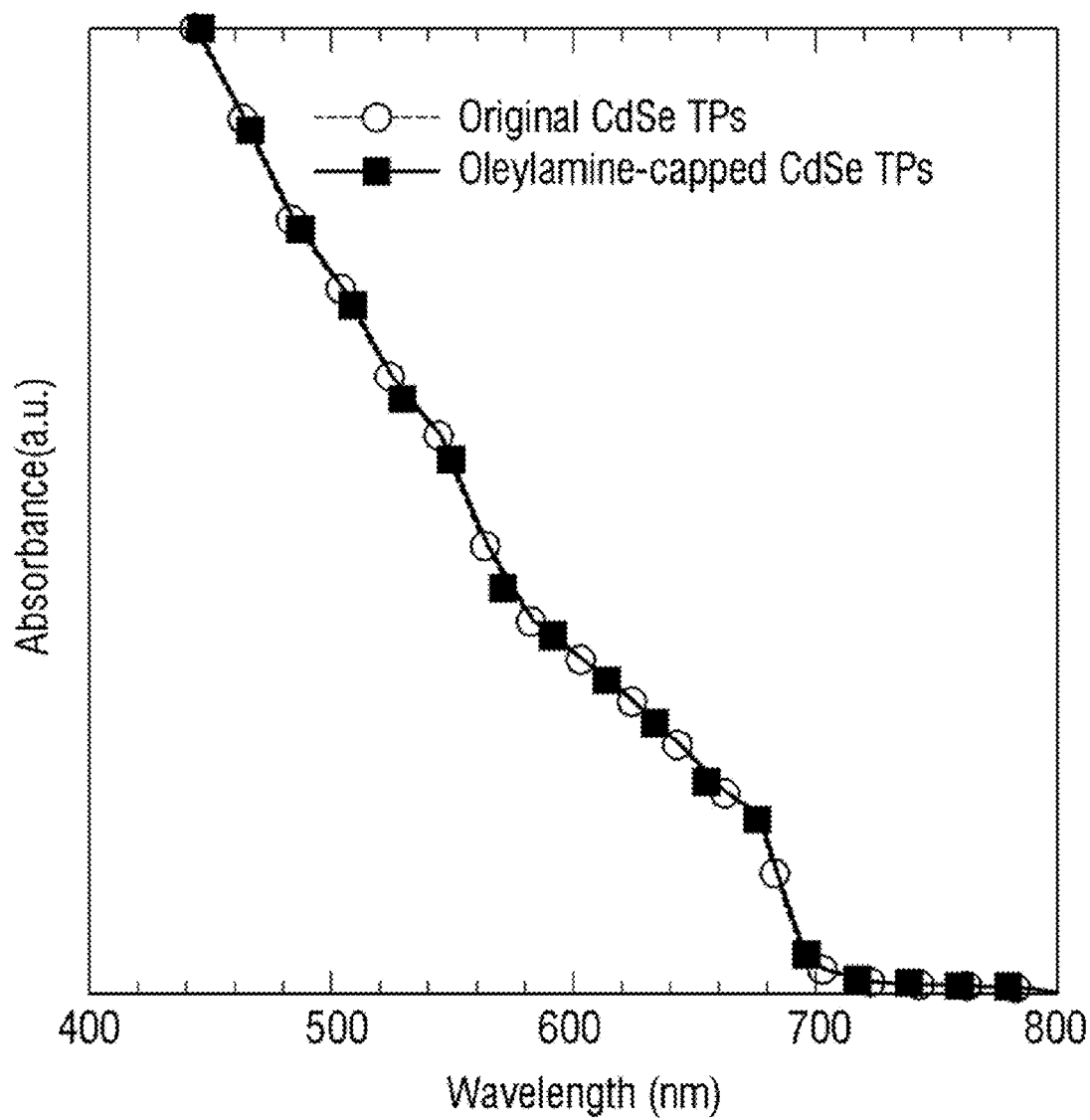

FIGS. 6A to 6C are views to illustrate a surface treatment effect that is obtained at operation of preparing the nanoparticles (S10) described above.

FIG. 6A is a view illustrating introduction of amine-based surfactant through surface modification of the semiconductor nanoparticles, and illustrates an operation of removing oleate from the nanoparticles surfaces and modifying the surfaces with oleylamine as described above.

FIG. 6B illustrates Fourier transform-infrared spectra (FT-IR) of a hydrocarbon chain that the surfactant has after/before treatment with $HBF_4$. It can be seen from FIG. 6B that the oleate (a rising portion in the middle of the dashed line graph) disappears from the graph (solid line graph) after treatment with $HBF_4$.

FIG. 6C illustrates absorption spectra of the CdSe tetrapod nanoparticles after/before surface modification (surface modification with oleylamine). It can be seen from FIG. 6C that the nanoparticles (graph connecting squares) with the ligand being modified have the same absorbing characteristic as that of the nanoparticles (graph connecting circles) before modification.

Removal of the X-type ligand and modification with the L-type ligand may be easily performed in various ways other than using $HBF_4$ (for example, treatment with $NOBF_4$, pyridine). The present disclosure is not limited to one of the various surface modification methods.

Figure 7:
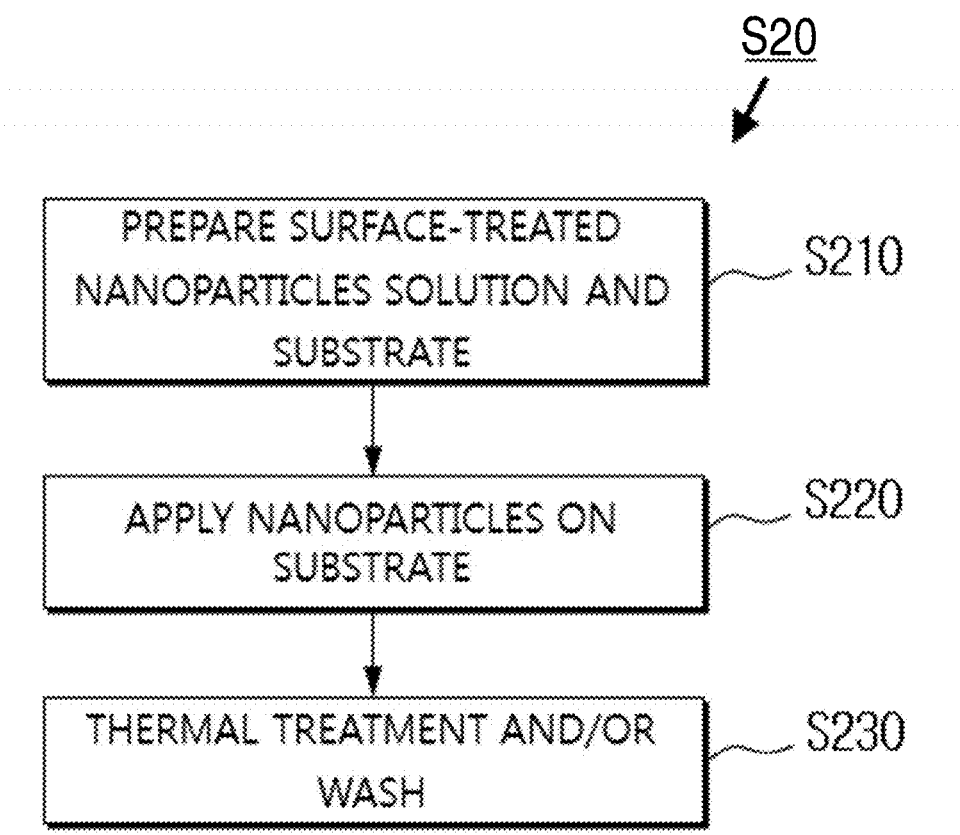
FIG. 7 is a flowchart illustrating an example of the operation of forming a nanoparticles film (S20) of FIG. 3.

FIG. 7 is a flowchart illustrating an example of the operation of forming the nanoparticles film (S20) of FIG. 3. First, the solution of the nanoparticles surface-treated at operation S10 and the substrate are prepared at operation S210. Concentration of the nanoparticles solution is set to 50 mg/mL according to an exemplary embodiment. However, the concentration of the nanoparticles solution may be changed variously according to an exemplary embodiment.

The substrate 10 for forming a semiconductor nanoparticles network may be comprised of a transparent or opaque electrode, or a buffer layer may be added to prevent loss in a charge transporter according to usage of the substrate 10. For example, a ZnO nanoparticles film may be added to a hole blocking layer according to an exemplary embodiment.

After that, a nanoparticles film is formed by applying the tetrapod nanoparticles 21 on the substrate 10. The tetrapod nanoparticles solution may be uniformly applied in various ways such as spin coating, doctor blade, dip coating, etc. In the illustrated exemplary embodiment, a uniform film is formed by spin coating (for example, at 2000 rpm for 30 seconds). The thickness of the film may be controlled by adjusting the concentration of the nanoparticles solution and speed of the spin coating. For example, in the case of tetrapod nanoparticles having branches of 70 nm, the thickness of the film may be adjusted to at least 70 nm and at most 300 nm by performing spin coating one time.

Next, the nanoparticles film is thermally treated and/or washed at operation S230. The thermal treatment at this operation is to cause adhesion among the nanoparticles. According to an exemplary embodiment, the thermal treatment may include first thermal treatment of the nanoparticles film (i); washing the nanoparticles film (ii); and second thermal treatment of the nanoparticles film (iii).

The first thermal treatment may be thermally treating the tetrapod nanoparticles film at about 40° C. to 300° C. for 1 minute to 600 minutes. The film after spin coating may undermine electrical characteristics and may be easily damaged because contact among the nanoparticles is blocked by the ligands. Accordingly, the thermal treatment of the film results in direct and permanent adhesion among the nanoparticles. At the operation of washing, organic matters are removed from the nanoparticles network film by washing the nanoparticles film with ethanol one or more times. A solution for washing may use one of various solvents that can dissolve the ligands. Also, the second thermal treatment may include thermally treating the nanoparticles film at 40° C. to 300° C. for 1 minute to 600 minutes. The second thermal treatment guarantees the contact among the nanoparticles and also may remove surplus solvent so that the tetrapod nanoparticles 23 from which the surfactant is removed adhere to one another directly and strongly.

Figure 8A:
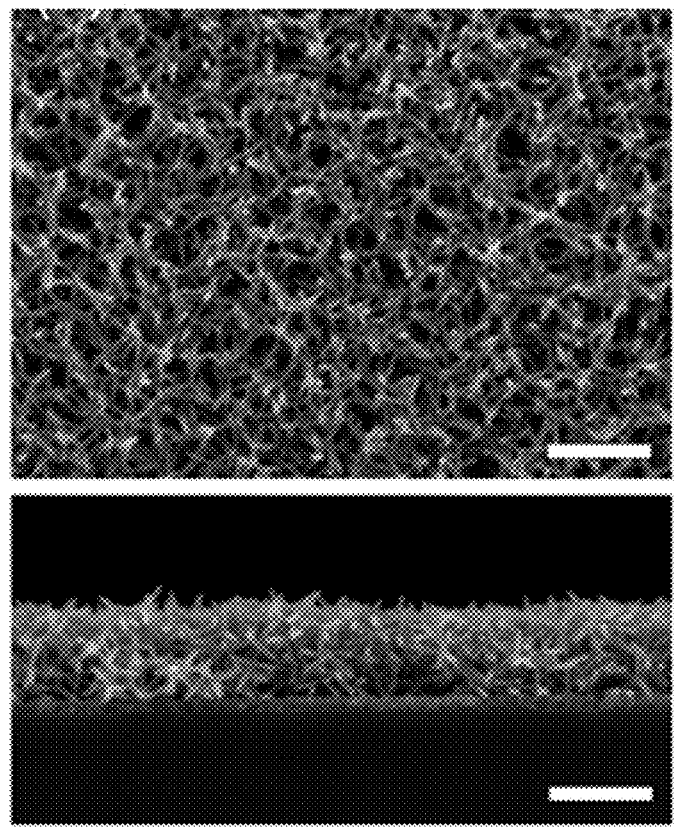
FIGS. 8A to 8C are views to explain an effect that is obtained at the operation of forming the nanoparticles film (S20)
Figure 8B:
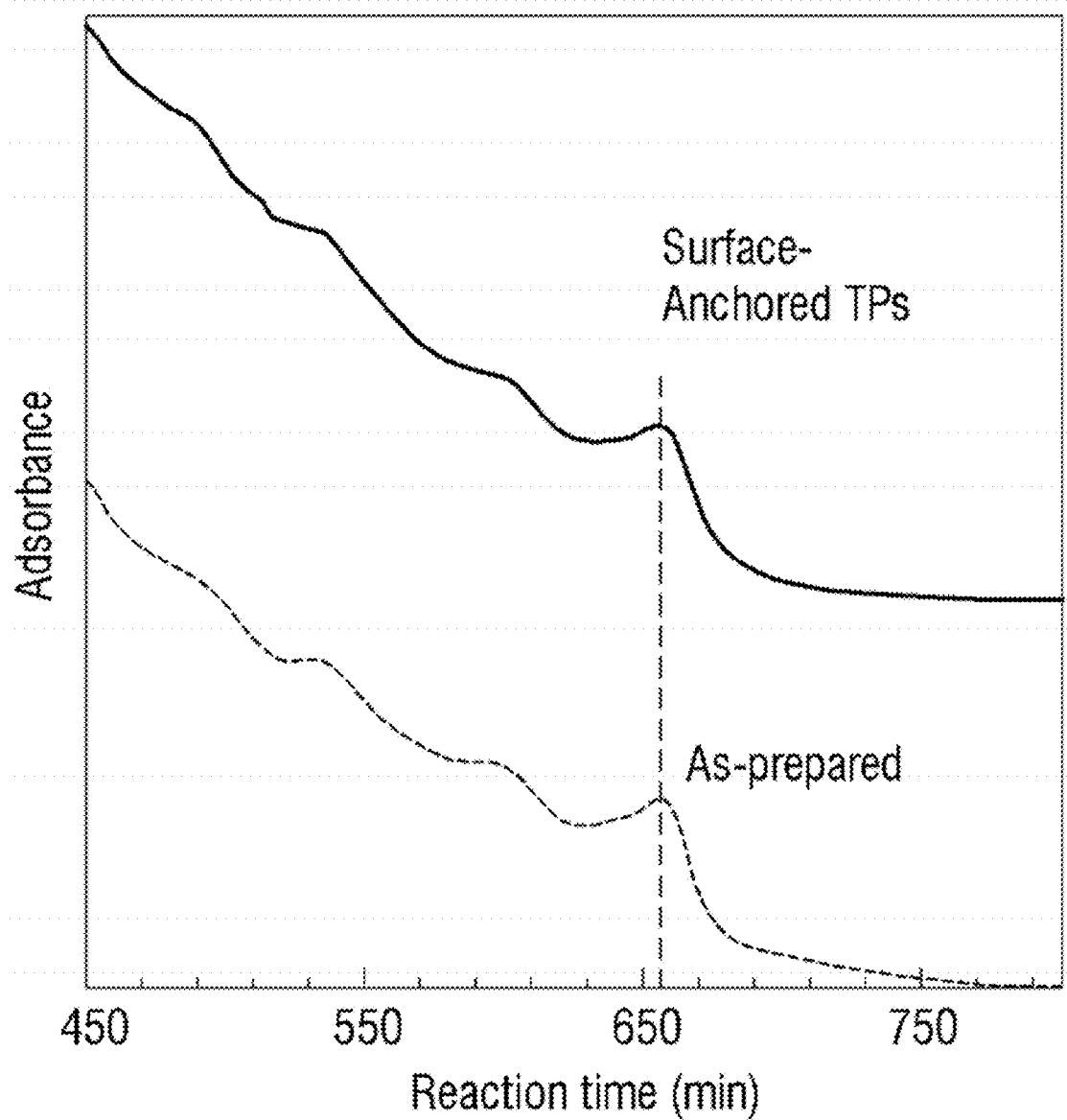
Figure 8C:
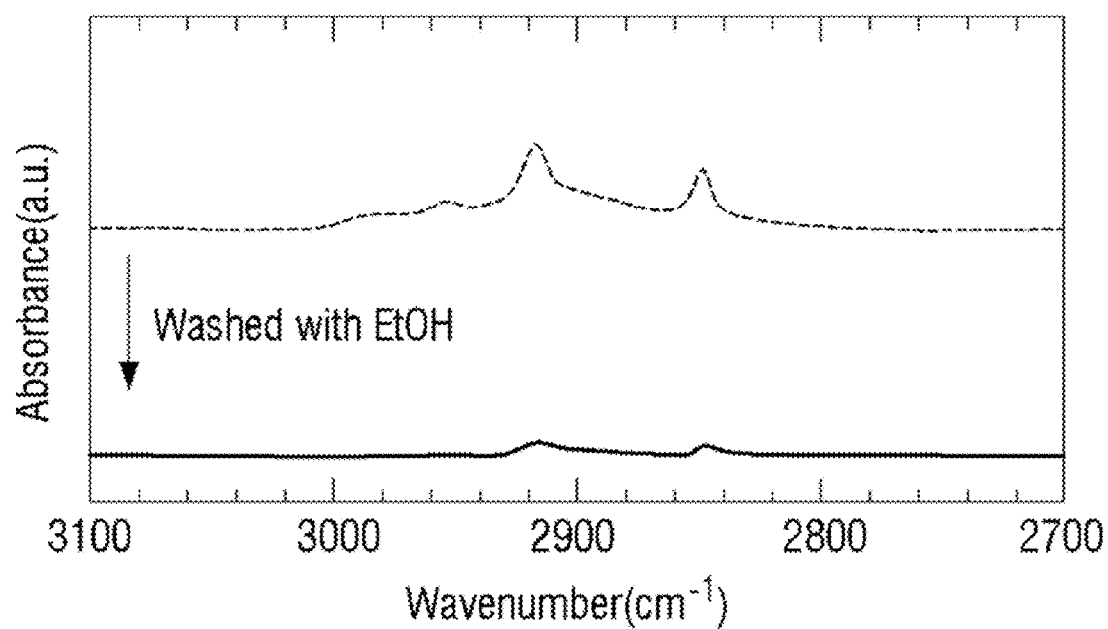

FIGS. 8A to 8C are views to illustrate an effect that is obtained at the operation of forming the nanoparticles film (S20) described above. FIG. 8A shows plan and cross sectional SEM images of the semiconductor nanoparticles network film, and illustrates a final network film of the tetrapod nanoparticles.

FIG. 8B illustrates absorption spectra (dashed lien graph) of the tetrapod nanoparticles after synthesis, and absorption spectra (solid line graph) of the tetrapod nanoparticles after film formation. Since the two graphs show the same absorbance, the nanoparticles' own absorbing characteristic can be maintained well even after the nanoparticles film is made.

FIG. 8C illustrates changes in the FI-IR absorption of an alkyl group after washing the nanoparticles film. As it can be seen that the FT-IR absorption spectra of the alkyl group moves from the dashed line graph to the solid line graph after washing the nanoparticles film (that is, the absorption spectra decrease), the surfactant remaining in the film may be removed by about 90% or more through the washing operation (S230).

In a method other than the above-described method, a film may be implemented by using tetrapod nanoparticles after synthesis, having an oletate ligand which is the X-type, and then organic ligands may be effectively removed by treatment with a base such as NaOH or KOH. Based on chemical characteristics of a buffer layer or other functional layers existing under the tetrapod nanoparticles film, the organic ligands may be removed from the film after or before the film is formed. However, it is more preferable that the organic ligands are removed after the surfaces of the tetrapod nanoparticles are modified in advance and the film is formed, because the lower functional layers can be prevented from being damaged by doing so.

Referring back to FIG. 3, after the semiconductor nanoparticles network film is formed at operation S20, surface treatment of the nanoparticles film may be further performed at operation S30. The surface treatment of the nanoparticles is performed at operation S10 (operations S120 and S130). However, the surface treatment at operations S120 and S130 is to remove organic matters from the nanoparticles surfaces in a nanoparticles solution state, whereas the surface treatment at operation S30 is to control electrical characteristics of the nanoparticles of a film state. To improve the electrical characteristics of the nanoparticles, the surfaces of the nanoparticles may be treated with an organic/inorganic compound of a solution state or a vapor state.

According to an exemplary embodiment, the surface of the film may be treated to reduce a surface state of the nanoparticles film. In this case, the surface treatment is performed by coating a solution containing a ligand for surface treatment on the nanoparticles film and drying the coated nanoparticles film.

The ligand for the surface treatment may be at least one selected from alkylamine, aromatic amine, alkylcarboxylic acid, aromatic carboxylic acid, alkylthiol, aromatic thiol, alkylphosphonic acid, aromatic phosphonic acid, halogen ($F_2$, $Cl_2$, $Br_2$, $I_2$) or ion thereof ($F^-$, $Cl^-$, $Br^-$, $I^-$), thiocyanate, nitrate, azide, hydroxide, oxalate, nitrate, isothiocyanate, nitrite, alkylphosphine, cyanide, and carbon monoxide, which has a molecule length of 3 nm or less.

For example, when a solution in which 1-hexylamine and acetone are mixed is used as the solution containing the ligand for the surface treatment, this solution is spin-coated and is dried at a predetermined temperature (for example, 60° C.) if necessary, so that the film of the nanoparticles 25 is formed with the surface state being effectively reduced.

It is common that it is necessary to control the surface state existing on the nanoparticles surfaces in order to apply the semiconductor nanoparticles to a solar cell. By modifying the surfaces of the semiconductor nanoparticles with 1-hexylamine, power loss in the surface state can be minimized.

According to an alternative embodiment, operation S30 may include coating organic matter-based precursors on the nanoparticles film and thermally treating the coated nanoparticles film. For example, the surface state may be controlled by treating CdSe tetrapod nanoparticles surfaces with a $CdCl_2$ or $Na_2S$ solution.

The surface treatment of the semiconductor nanoparticles at operation S30 may vary according to a kind of matter, and may improve electrical characteristics of the nanoparticles by controlling functional groups interacting with the nanoparticles surfaces and molecular structures thereof. Also, operation S30 may be omitted according to subsequent operation S40.

Figure 9:
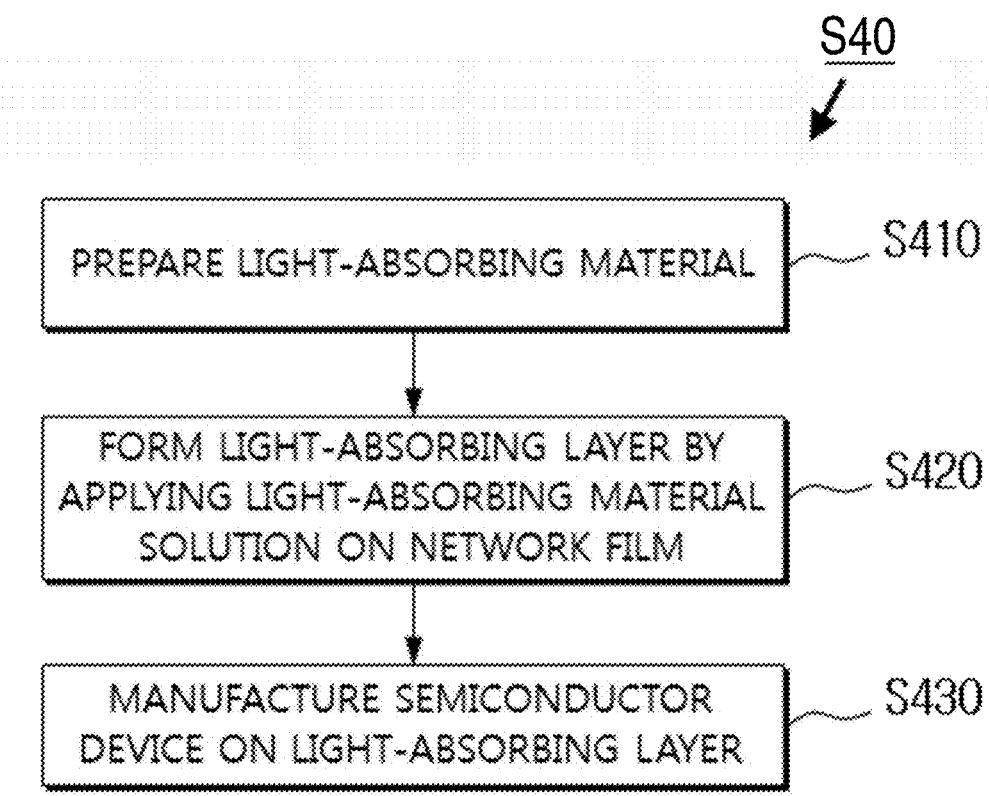
FIG. 9 is a flowchart illustrating an example of the operation of manufacturing a semiconductor device (S40) of FIG. 3.

FIG. 9 is a flowchart illustrating an example of the operation of manufacturing the semiconductor device (S40) of FIG. 3. First, light-absorbing material is prepared to form a light-absorbing layer at operation S410. A light-absorbing material solution may be selected from a conducting polymer or conducting monomer solution, a fluorene-based molecule solution, an inorganic semiconductor nanoparticles solution, an inorganic semiconductor precursor solution, or a mixture of two or more types of the above-mentioned solutions.

According to an exemplary embodiment, a poly(3-hexylthiophene) (P3HT) solution may be used. In this case, a heterostructure-based active layer may be made by using the semiconductor nanoparticles network film as an n-type matter and by using P3HT as a p-type matter. According to an exemplary embodiment, a solution of P3HT 2 wt % may be prepared by using monochlorobenzene as a solvent, and is agitated for 24 hours so that the polymer is sufficiently dissolved.

After that, a light-absorbing layer 30 is formed by coating the light-absorbing material solution on the nanoparticles film. For example, the nanoparticles network film is coated with the P3HT solution prepared at operation S410 and is spin-coated at 1000 rpm for 30 seconds. The conducting polymer penetrates through the porous nanoparticles network film, thereby forming an active layer.

Figure 10A:
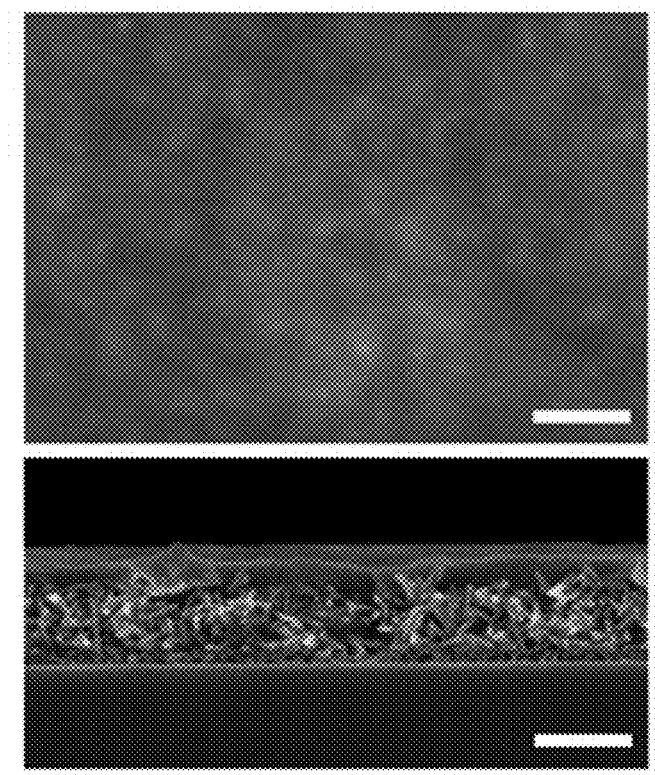
FIGS. 10A and 10B are views to illustrate an effect that is obtained at the operation of forming a light-absorbing layer (S420)
Figure 10B:
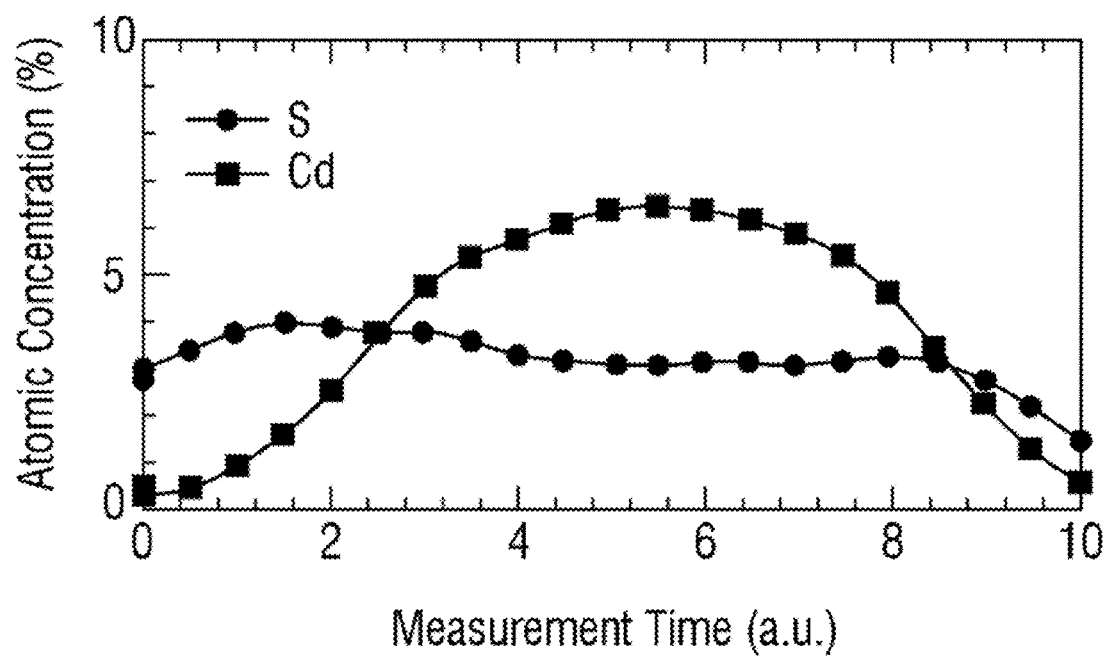

Regarding this, FIGS. 10A and 10B illustrate an effect that is obtained at the operation of forming the light-absorbing layer (S420). FIG. 10A shows plan and cross sectional SEM images after P3HT penetrates into the nanoparticles film. FIG. 10B is a graph showing distribution of sulfur (S) (conducting polymer) and cadmium (Cd) (tetrapod nanoparticles) taken by Auger electron spectroscopy, and illustrates a signal that is measured from a lower portion of the nanoparticles film with time (from the left of the x-axis to the right). That is, it can be seen from this graph that the nanoparticles surface is covered with the conducting polymer and the conducting polymer penetrates into the tetrapod nanoparticles film under the surfaces.

In the above-described embodiment, P3HT is used as the conducting polymer solution. However, one of the conducting polymer solution, nanoparticles solution and PTB7:$PC_{70}BM$ solution of other components may be used (PTB7 is Poly[[4,8-bis[(2-ethylhexyl)oxy]benzo[1,2-b:4,5-b'] dithiophene-2,6-diyl][3-fluoro-2-[(2-ethylhexyl)carbonyl] thieno[3,4-b]thiophenediyl], and PCBM is Phenyl-C71-butyric acid methyl ester].

Referring back to FIG. 9, a semiconductor device 40 is formed on the light-absorbing layer at operation S430. At this time, when the semiconductor device is a solar cell, the semiconductor device 40 may be formed by forming a buffer layer on the light-absorbing layer 30 and then depositing a metal electrode on the buffer layer at operation S430. According to an exemplary embodiment, the solar cell may be manufactured by forming 10 nm of MoOx, which is a buffer layer, on the light-absorbing layer and depositing an Al electrode on the buffer layer with a thickness of 100 nm.

Figure 11A:
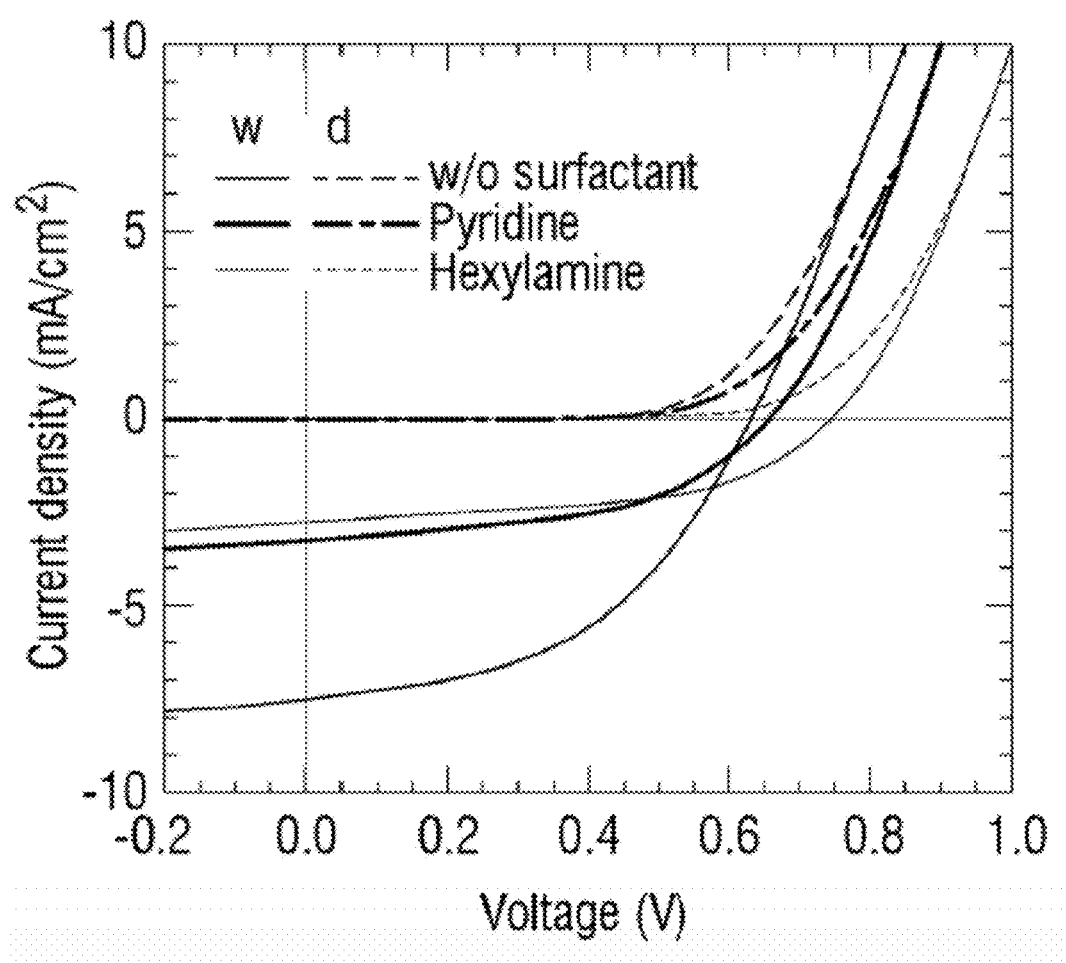

Regarding this, FIGS. 11A and 11B illustrate characteristics of the solar cell which is formed at operation S430. FIG. 11A illustrate current-voltage characteristics of the solar cell manufactured according to the above-described exemplary embodiment, and FIG. 11B illustrates these characteristics in a table.

In FIG. 11A, the black line indicates the case in which the surface treatment (S30) is not performed in FIG. 3, and the blue and red lines indicate the case in which the surface is treated with pyridine and hexylamine. It can be seen from FIG. 11B that when the nanoparticles network film is surface-treated with hexylamine, power conversion efficiency (PCE) is greatly increased, and, that the surface treatment of the nanoparticles is an important factor to improve characteristics of the solar cell in the above-described exemplary embodiment.

Surface density of the nanoparticles may be adjusted by controlling the concentration of the nanoparticles solution or a film coating condition. When a nanoparticles solution of low concentration is applied on the substrate, it is possible to manufacture a film in the form of nanoparticles being spaced away from one another. In this case, since organic matters are removed, electric contact on interfaces between the substrate and the nanoparticles or interfaces between the nanoparticles and an additional function layer can be improved.

Figure 12A:
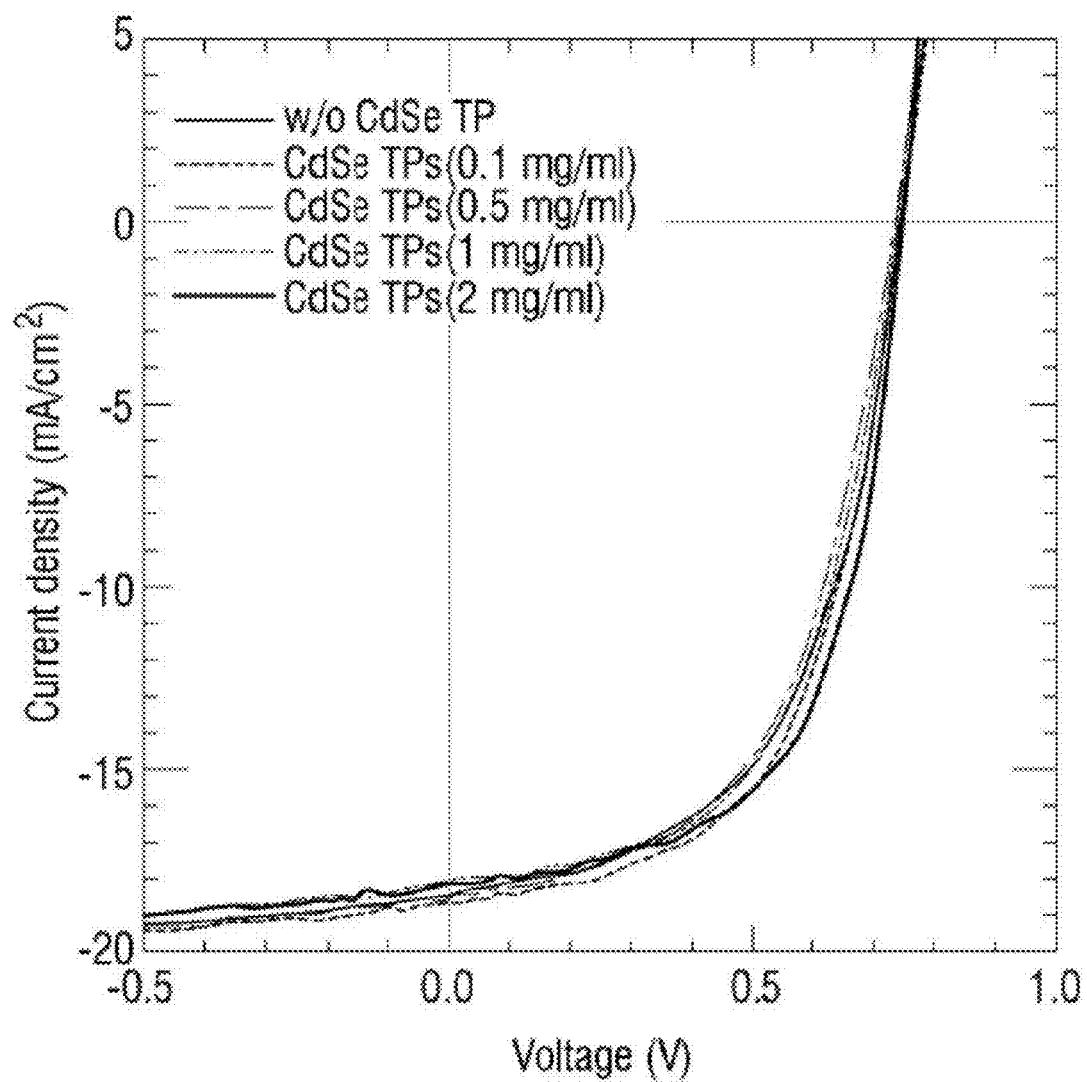

Regarding this, FIGS. 12A and 12B illustrate characteristics of a solar cell according to an alternative embodiment. In the alternative embodiment, a single layer of tetrapod nanoparticles is formed by applying a tetrapod nanoparticles solution of low concentration to the substrate, and fixed, and then a light active layer is formed by applying a light-absorbing layer of a general organic collar cell.

In this alternative embodiment, a mixture solution of PTB7 and PCBM which show good power conversion efficiency is used for the single-layer film of the tetrapod nanoparticles as light-absorbing material. FIG. 12A is a graph illustrating characteristics of a solar cell in the alternative exemplary embodiment, and FIG. 12B is a table showing these characteristics. The first experiment of FIG. 12B illustrates characteristics of a solar cell that is manufactured with only light-absorbing material of PTB7:PCBM without using nanoparticles, and the second and third experiments of FIG. 12B illustrate the cases in which a solar cell is manufactured with nanoparticles solutions of concentrations of 1 mg/ml and 2 mg/ml, respectively. When the nanoparticles solution of the concentration of 2 mg/ml is used, the power conversion efficiency increases in comparison to the related-art method.

While the present disclosure has been described with the above-described exemplary embodiments and drawings, the present disclose is not limited to the above-described embodiments. Although the solar cell is manufactured as the semiconductor device in the above-described exemplary embodiments, the nanoparticles film of the present disclosure essentially has semiconductor characteristics and thus may be used in various semiconductor devices such as a light emitting diode, a transistor, or etc. Therefore, it will be understood by those of ordinary skill in the art that various changes in form and details may be made therein from the above descriptions. It should be understood that the scope of the present disclosure is not limited to the above-described exemplary embodiments and is defined by claims presented below and equivalents to claims.

What is claimed is:

1. A method of manufacturing a light-absorbing layer comprising semiconductor nanoparticles, the method comprising:
    forming a nanoparticles film by applying a solution of semiconductor nanoparticles on a substrate;
    thermally treating the nanoparticles film at least one time to cause adhesion among the nanoparticles;
    surface-treating the nanoparticles film in order to reduce a surface state of the nanoparticles film by (i) coating the nanoparticles film with a solution containing a ligand for surface treatment and (ii) drying the coated nanoparticles film; and
    forming a light-absorbing layer by applying a light-absorbing solution on the nanoparticles film,
    wherein each of the semiconductor nanoparticles has at least one of a tetrapod shape and a hyper-branched shape,
    wherein the method further comprises, before forming the nanoparticles film:
    dispersing the semiconductor nanoparticles in a solvent; and
    modifying surfaces of the semiconductor nanoparticles to an L-type ligand.

2. The method of claim 1, wherein the thermally treating comprises:
    first thermal treatment of the nanoparticles film;
    washing the nanoparticles film; and
    second thermal treatment of the nanoparticles film.

3. The method of claim 2, wherein the first thermal treatment comprises thermally treating the nanoparticles film at 40° C. to 300° C. for 1 to 600 minutes, and the second thermal treatment comprises thermally treating the nanoparticles film at 40° C. to 300° C. for 1 to 600 minutes.

4. The method of claim 1, wherein the modifying the surfaces comprises modifying an X-type ligand of the surfaces of the nanoparticles to the L-type ligand.

5. The method of claim 4, wherein the L-type ligand comprises one or more compounds selected from the group consisting of primary, secondary, or tertiary alkylamine, primary, secondary, or tertiary alkylphosphine, and primary, secondary, or tertiary alkylphosphine oxide having one or more saturated, unsaturated, or aromatic hydrocarbon chains, which have 1 to 30 carbons, in a straight-chain type or branch type.

6. The method of claim 1, wherein the ligand for surface treatment is at least one selected from alkylamine, aromatic amine, alkylcarboxylic acid, aromatic carboxylic acid, alkylthiol, aromatic thiol, alkylphosphonic acid, aromatic phosphonic acid, halogen or ions thereof, thiocyanate, nitrate, azide, hydroxide, oxalate, nitrate, isothiocyanate, nitrite, alkylphosphine, cyanide, and carbon monoxide.

7. A method of manufacturing a light-absorbing layer comprising semiconductor nanoparticles, the method comprising:
    forming a nanoparticles film by applying a solution of the semiconductor nanoparticles on a substrate;
    thermally treating the nanoparticles film at least one time to cause adhesion among the nanoparticles;
    surface-treating the nanoparticles film in order to reduce a surface state of the nanoparticles film by (i) applying an inorganic matter-based precursor on the nanoparticles film and (ii) thermally treating the nanoparticles film; and
    forming a light-absorbing layer by applying a light-absorbing solution on the nanoparticles film,
    wherein each of the semiconductor nanoparticles has at least one of a tetrapod shape and a hyper-branched shape,
    wherein the method further comprises, before forming the nanoparticles film:
    dispersing the semiconductor nanoparticles in a solvent; and
    modifying surfaces of the semiconductor nanoparticles to an L-type ligand.

8. The method of claim 1, wherein the light-absorbing solution is selected from a conducting polymer or conducting monomer solution, a fluorene-based molecule solution, an inorganic semiconductor nanoparticles solution, an inorganic semiconductor precursor solution, or a mixture of two or more types of the above-mentioned solutions.

9. A method of manufacturing a semiconductor device comprising a light-absorbing layer, the method comprising:
    forming a light-absorbing layer according to claim 1; and
    forming a semiconductor device on the light absorbing layer.

10. The method of claim 9, wherein the semiconductor device is a solar cell, and
    wherein the forming the semiconductor device comprises depositing a metal electrode on the light-absorbing layer.

11. The method of claim 10, further comprising forming a buffer layer on the light-absorbing layer before the depositing the metal electrode on the light-absorbing layer.

* * * * *